(12) United States Patent
Ng et al.

(10) Patent No.: US 7,307,898 B2
(45) Date of Patent: Dec. 11, 2007

(54) METHOD AND APPARATUS FOR IMPLEMENTING WALKOUT OF DEVICE JUNCTIONS

(75) Inventors: Philip S. Ng, Cupertino, CA (US); Jinshu Son, Saratoga, CA (US); Johnny Chan, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 21 days.

(21) Appl. No.: 11/291,498

(22) Filed: Nov. 30, 2005

(65) Prior Publication Data

US 2007/0121384 A1 May 31, 2007

(51) Int. Cl.
*G11C 5/14* (2006.01)
*G11C 7/10* (2006.01)
*G11C 7/00* (2006.01)
*G11C 16/04* (2006.01)

(52) U.S. Cl. .......................... 365/189.09; 365/189.06; 365/189.11; 365/185.18

(58) Field of Classification Search ........... 365/189.09, 365/189.06
See application file for complete search history.

(56) References Cited

U.S. PATENT DOCUMENTS

| 4,888,738 A | * | 12/1989 | Wong et al. | ............ | 365/185.22 |
| 4,928,159 A | * | 5/1990 | Mihara et al. | .............. | 257/370 |
| 5,486,486 A | * | 1/1996 | Ghezzi et al. | .............. | 438/201 |
| 2004/0233718 A1 | * | 11/2004 | Yaoi et al. | ............. | 365/185.11 |

* cited by examiner

*Primary Examiner*—Ly Duy Pham
(74) *Attorney, Agent, or Firm*—Sierra Patent Group, Ltd.

(57) ABSTRACT

A high-voltage charge pump circuit includes a charge pump circuit. A first high-voltage output circuit is configured to set an output voltage of the charge pump at a first voltage level selected for regular programming and erasing memory cells. A second high-voltage output circuit is configured to set the output voltage of the charge pump at a second voltage level selected for walkout of device junctions, the second voltage level being higher than the first voltage level. A third high-voltage output circuit is configured to set the output voltage of the charge pump at a third voltage level selected for guardband programming and erasing, the third voltage level being lower than the second voltage level and higher than the first voltage level. Selection circuitry selectively couples one of the first, second, and third high-voltage output circuits to the output of the high-voltage charge pump circuit.

8 Claims, 5 Drawing Sheets

METHOD AND APPARATUS FOR IMPLEMENTING WALKOUT OF DEVICE JUNCTIONS

BACKGROUND OF THE INVENTION

1. Field of the Invention

The present invention relates to integrated circuit technology. More particularly, the present invention relates to apparatus and methods for implementing walkout of device junctions in an integrated circuit.

2. The Prior Art

In non-volatile memory integrated circuits such as flash memory and EEPROM memory integrated circuits, a high-voltage charge pump circuit is used to generate high voltage for programming and erasing operations. A circuit is used to set the high-voltage charge pump output at an optimized voltage level best for the programming and erasing operations.

Memory cell margins are important considerations. An "off" cell has a high threshold voltage (for example, +2V), and an "on" cell has a low threshold voltage (for example, −2V). If a sense amplifier has a reference voltage of 0V, then the margin for an "off" cell is 2V−0V=2V, and the margin for "on" cell is 0V−2V=−2V. If the clamped high-voltage level is too low, a non-volatile memory cannot be programmed or erased well and as a result, margins for both "on" cells and "off" cells will be poor. A weakly programmed "on" cell may have threshold voltage of −0.5V, and the margin for that "on" cell is only 0V−0.5V=−0.5V. A weakly erased "off" cell may have threshold voltage of +0.5V and the margin for that "off" cell is only 0.5V−0V=0.5V.

Endurance is defined as the number of programming and erasing cycles that can be performed before the margin window collapses, that is, the margins for both "off" and "on" cells become so small that the sense amplifier can no longer sense whether the cell is "off" or "on." The endurance of a memory cell will be poor if the margins for both "off" and "on" cells are poor.

Data retention is defined as the number of years a memory cell can keep its charge and maintain appropriate margins to be correctly sensed by the sense amplifier. If the high voltage level to which the programming and erasing charge pump has been set is too high, the margins for both "off" and "on" cells may be better but data retention may be worse. This is because the thin oxide through which programming takes place may be damaged by the high electric field present during program and erase operations and a leakage path may be generated causing data loss. A well-controlled and optimized high-voltage clamp level is needed in order for the memory to have both good endurance and good data retention.

In the prior art, the oxides used for tunneling or for hot electron injection may be fabricated thinner to achieve better margins, but thinner oxides are more susceptible to damage from exposure to high electric fields. Consequently, endurance is better but data retention is worse. If oxides for tunneling or for hot electron injection are fabricated thicker to achieve better data retention, the high-voltage level to which the programming and erasing charge pump is clamped needs to be higher in order to program or erase through the thicker oxide. If the clamped high voltage is too high, and exceeds the breakdown voltage of the transistor devices that are exposed to it, leakage may occur in these devices causing a high-voltage flip-flop to flip to an opposite, incorrect state, or cause other misoperations. In addition, if the clamped high voltage level is too high, the critical oxide layers through which programming and erase operations are conducted are more susceptible to damage from exposure to high electric fields. As a result, data retention may suffer.

BRIEF DESCRIPTION OF THE INVENTION

A high-voltage charge pump setting circuit for a programmable memory integrated circuit includes a first high-voltage setting circuit configured to set the charge pump voltage at a first voltage level selected for regular programming and erasing memory cells, a second high-voltage setting circuit configured to set the charge pump voltage at a second voltage level selected for walkout of device junctions, the second voltage level being higher than the first voltage level, a third high-voltage setting circuit configured to set the charge pump voltage at a third voltage level selected for guardband programming and erasing, the third voltage level being lower than the second voltage level and higher than the first voltage level, and selection circuitry for selectively coupling one of the first, second, and third high-voltage setting circuits to the output of a high-voltage charge pump circuit. The voltage setting circuits may comprise, for example, clamp circuits or voltage regulator circuits. Additional walkout voltage settings, higher than the first walkout voltage setting, may also be provided by the circuit.

A method for operating a programming and erase charge pump in a programmable memory integrated circuit includes setting the high-voltage output of the charge pump at one of three levels. A first voltage setting circuit is used to set the high-voltage output of the charge pump at a first voltage level selected for regular programming and erasing memory cells by a user during normal operation of the programmable memory integrated circuit. A second voltage setting circuit is used to set the high-voltage output of the charge pump at a second voltage level selected for walkout of device junctions, the second voltage level being higher than the first voltage level. The second level is used during walkout of device junction breakdown voltages in the programmable memory integrated circuit. A third voltage setting circuit is used to set the high-voltage output of the charge pump to a third voltage level selected for guardband programming and erasing, the third voltage level being lower than the second voltage level and higher than the first voltage level. The third setting level is used by the manufacturer to set guardband levels in the programmable memory integrated circuit. Additional walkout voltage settings, higher than the first walkout voltage setting, may also be provided.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention is suitable for use in memory integrated circuits such as EEPROMs and other non-volatile memories such as flash memory.

In order to address these issues in the prior art, circuits having multiple selectable voltage levels are used to achieve both good endurance and good data retention. By programming, e.g., programming extra memory cells disposed on the integrated circuit, three or more levels of programming and erase voltages can be selected.

Figure 1:
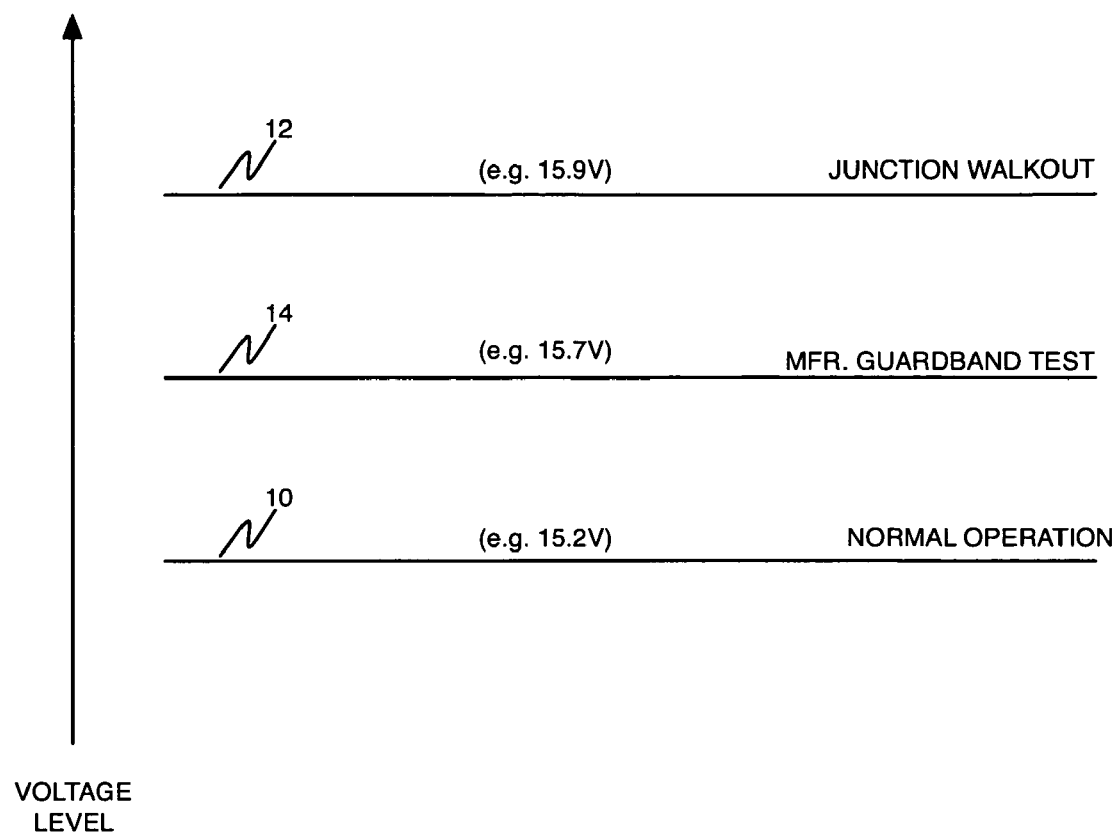
FIG. 1 is a diagram illustrating the different clamp levels provided for in the present invention.

Referring first to FIG. 1, a voltage-level diagram shows an illustrative embodiment of the present invention. According to the present invention, and as illustrated in FIG. 1, a multiple-level-selectable clamp circuit is employed to achieve both good endurance and good data retention.

As shown in FIG. 1, a regular programming and erasing voltage level, shown diagrammatically at reference numeral 10, that provides good margins for both "off" and "on" cells during normal operation of the memory integrated circuit may be selected. Multiple voltage-setting circuits for this level may be provided such that multiple clamp levels can be selected to search for the optimized one for a certain oxide thickness where the oxide will not be damaged (good data retention) and at the same time margins for "off" and "on" cells are good.

As also shown in FIG. 1, a special programming and erasing voltage level much higher than the regular clamp level and shown diagrammatically at reference numeral 12, may be used to walkout the device junctions to a higher breakdown voltage. The device junctions of the individual die can be walked out with this clamp setting (for example, during wafer sort). This is done to make sure that the chip will not operate with a high voltage level that is close to the device breakdown voltage, thus preventing high-voltage flip-flops in the circuitry from flipping to an opposite erroneous state, or other misoperations.

As also shown in FIG. 1, a guardband programming and erasing voltage level is shown diagrammatically at reference numeral 14. This voltage level is higher than normal operating voltage level but is lower than the walkout voltage (for example, 0.5V higher than the normal operating programming and erasing clamp level). This voltage level may be selected in order to make sure the walked out breakdown voltage will not walk back in to a level too close to the normal operating level and to make sure that the chip has enough guardband from misoperation due to the high-voltage charge pump output voltage being too close to breakdown voltage. The chip may be tested at this voltage level (for example, during the second wafer sort process).

Figure 2:
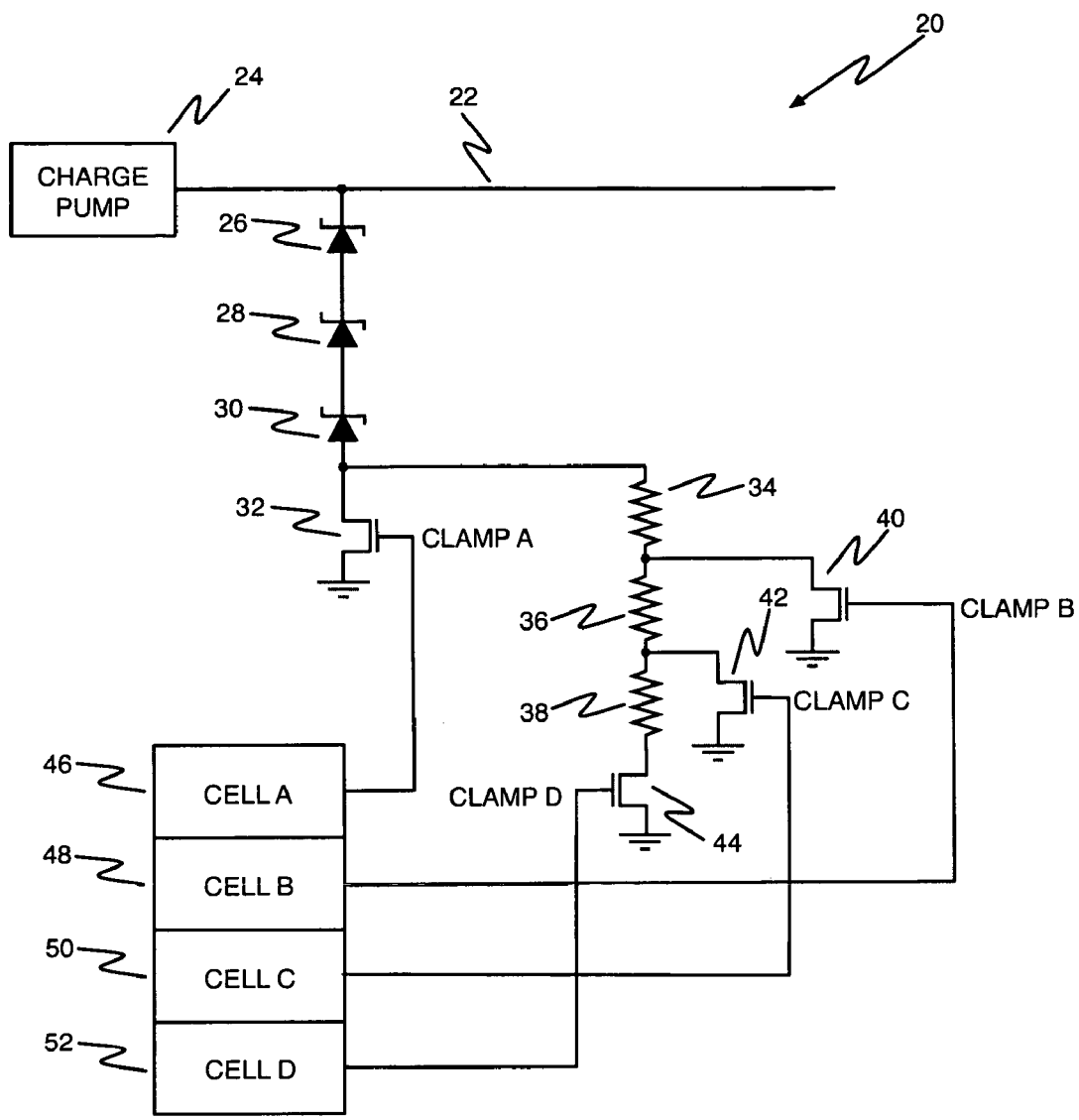
FIG. 2 is a schematic diagram of an illustrative charge-pump clamping arrangement in accordance with the principles of the present invention.

Referring now to FIG. 2, a schematic diagram shows an exemplary charge-pump clamping arrangement in accordance with the principles of the present invention. The particular circuit depicted in FIG. 2 allows clamping the charge pump output at four difference voltage levels. Charge-pump clamping circuit 20 clamps the output line 22 of charge pump 24 at either the normal-operation level, the walkout level, or the guardband level as has been disclosed herein.

A voltage clamp circuit includes zener diodes 26, 28, and 30 connected in series between charge pump output line 22 and ground. A first n-channel MOS transistor 32 selectively couples the anode of zener diode 30 to ground when a CLAMP A signal is applied to its gate. The CLAMP A signal causes the clamp circuit to clamp the charge pump output voltage at the normal operating level.

The anode of zener diode 30 is coupled to ground through series-connected resistors 34, 36, and 38. N-channel MOS transistor 40 couples the bottom terminal of resistor 34 to ground when a CLAMP B signal is applied to its gate. N-channel MOS transistor 42 couples the bottom terminal of resistor 36 to ground when a CLAMP C signal is applied to its gate. N-channel MOS transistor 44 couples the bottom terminal of resistor 38 to ground when a CLAMP D signal is applied to its gate.

When the CLAMP B signal is asserted at the gate of n-channel MOS transistor 40, resistor 34 is added in series to the clamp circuit. When the CLAMP C signal is asserted at the gate of n-channel MOS transistor 42, resistors 34 and 36 are added in series to the clamp circuit. When the CLAMP D signal is asserted at the gate of n-channel MOS transistor 44, resistors 34, 36, and 38 are added in series to the clamp circuit.

Resistors 34, 36, and 38 are chosen to drop voltages sufficient to establish the desired clamped charge pump output potentials. The resistors 34, 36, and 38 will drop about 0.1V per 1K ohm of resistance. This can be seen from an examination of FIG. 3, a plot of voltage vs. current illustrating how resistors may be used in the clamp circuits to generate small voltage drops. The V/I curve of the charge pump output is shown at reference numeral 60. As may be seen, the voltage at zero current is at a maximum, and it decreases as a function of the amount of current drawn by the load until at a short circuit the voltage is zero.

The curve at reference numeral 62 is a I/V curve for a zener diode with no resistor in series. It intersects the I/V curve of the charge pump at reference numeral 64 at a first voltage $V_1$. The curve at reference numeral 66 is a I/V curve for a zener diode with a resistor in series. It intersects the I/V curve of the charge pump at reference numeral 68 at a second voltage $V_2$. From an examination of FIG. 3, it may be seen that the use of a resistor moves the I/V curve to the right intersects the output voltage curve of the charge pump at a location on the voltage axis that lies to the right (at a higher voltage) than curve 62. If the resistor has a resistance of 1K ohm, curve 66 intersects the I/V curve of the charge pump about 0.1 volts further than the intersection of the I/V curve of the zener diode by itself on the charge pump output curve.

In the example given in FIG. 2, the CLAMP A signal is activated to produce the desired 15.2V operating voltage at the charge pump output. Resistor 34 would be formed to a value of 5K ohms to drop 0.5V to produce the desired 15.7V guardband voltage at the charge pump output if the CLAMP B signal is activated. Similarly, resistor 36 would be formed to a value of 2K ohms to drop 0.7V across the combination of resistors 34 and 36 to produce the desired 15.9V walkout voltage at the charge pump output if the CLAMP C signal is activated. Finally, resistor 38 would be formed to a value of 2K ohms to drop 0.9V across the combination of resistors 34, 36, and 38 to produce 16.1V at the charge pump output to allow for a second walkout potential (not shown in FIG. 1) higher than 15.9V to be used if the CLAMP D signal is activated.

Figure 3:
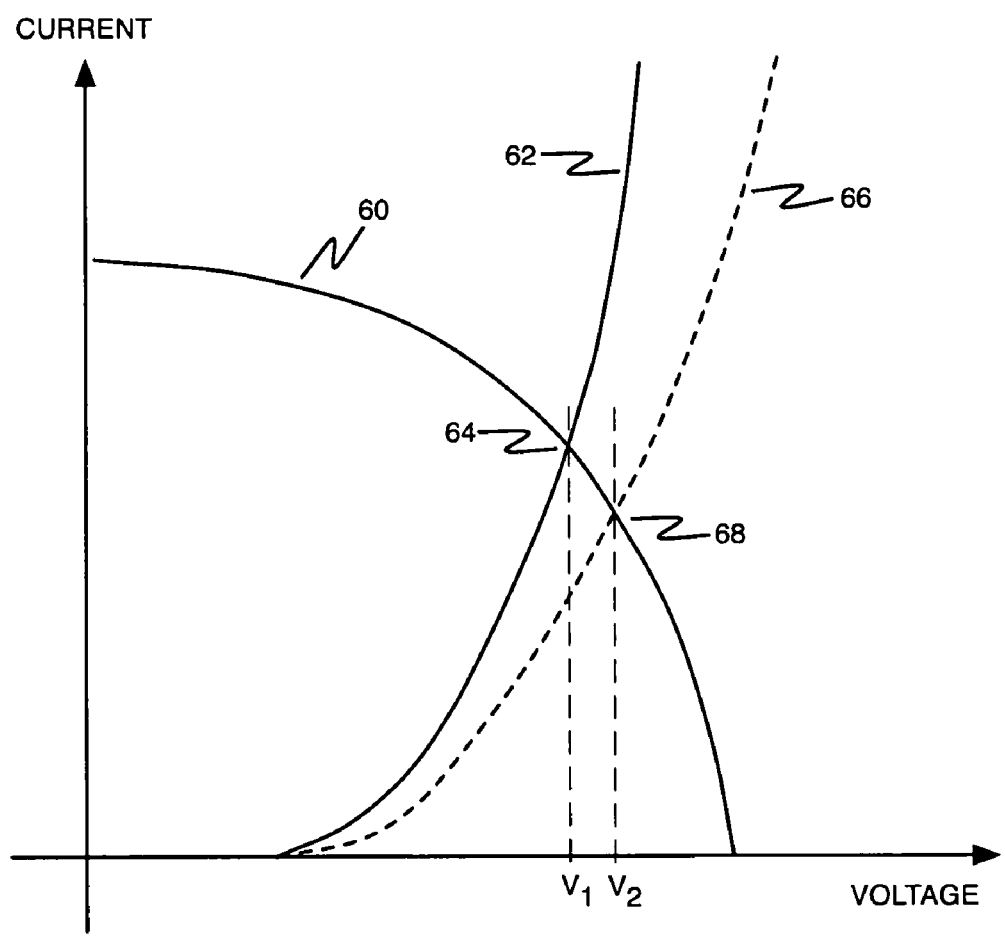
FIG. 3 is a plot of voltage vs. current illustrating the use of resistors in the clamp circuits to generate small voltage drops.

Persons of ordinary skill in the art will recognize that the circuit of FIG. 2 could be modified by employing a string of forward-biased diodes, formed, for example, as diode-connected MOS transistors, in place of the zener diodes 26, 28, and 30. As will be appreciated by persons of ordinary skill in the art, such diodes have a forward voltage drop of about 1V, so fifteen of the devices would be needed in place of the three zener diodes to achieve a voltage drop of 15V. The voltage drops of less than one volt shown in FIG. 3 used for the three voltage levels can also be achieved with the forward-biased diodes using resistors as shown in FIG. 3.

Figure 4A:
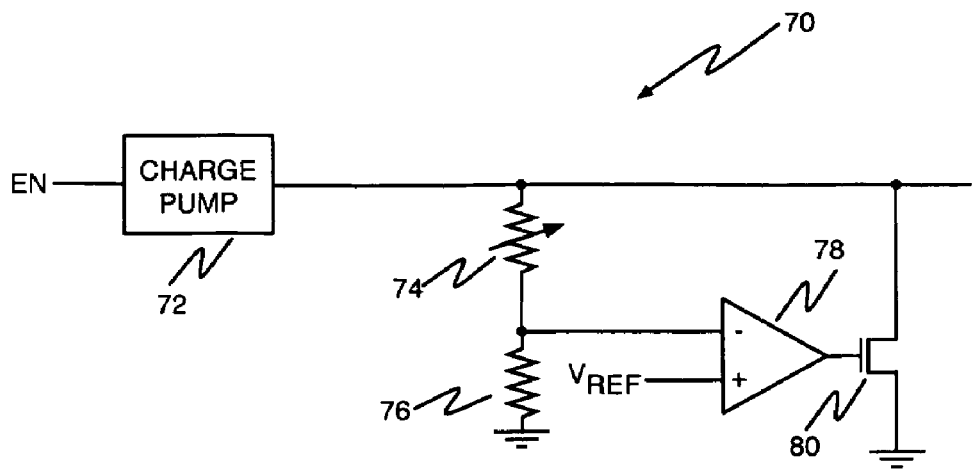
FIGS. 4A and 4B are, respectively, a schematic diagram of an illustrative regulator circuit suitable for use in the present invention, and an arrangement for adjusting the output of that voltage regulator circuit by altering the sense voltage supplied to the regulator.

There are alternate circuitry that may be used to generate the different voltage levels used for normal operation, walkout, and guardband testing according to the present invention. All such circuitry is considered to be within the scope of the present invention. For example, a voltage regulator employing switchable sensing voltage levels could be employed. A schematic diagram of an illustrative regulator circuit 70 of this type is shown in FIG. 4A. Regulator circuit 70 regulates the output of charge pump circuit 72. A voltage divider including resistors 74 and 76 provides a sense voltage to the inverting input of comparator 78. The voltage at the inverting input of comparator 78 is compared with the voltage $V_{REF}$ at the non-inverting input of comparator 78. When the voltage at the inverting input of comparator 78 exceeds the voltage $V_{REF}$, the comparator 78 changes state and turns on n-channel MOS transistor 80 as is known in the art, thus regulating the output of the charge pump to the voltage value set by the voltage divider and $V_{REF}$. In this circuit, changing voltages is achieved by varying the value of resistor 74.

Figure 4B:
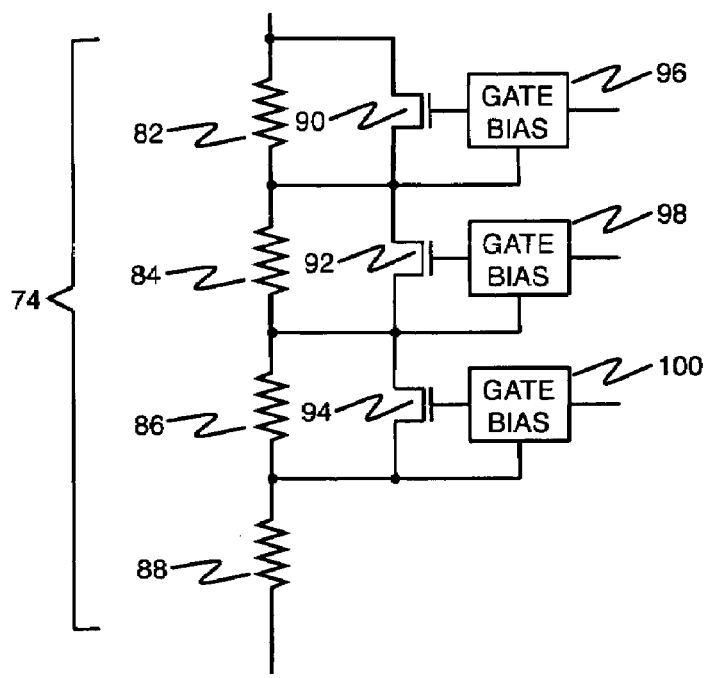

Details of an illustrative way to achieve the switchable sensing voltage levels are shown in FIG. 4B. As shown in FIG. 4B, resistor 74 is composed of four separate resistors 82, 84, 86, and 88. N-channel MOS transistor 90 selectively short circuits resistor 82; n-channel MOS transistor 92 selectively short circuits resistor 84; n-channel MOS transistor 94 selectively short circuits resistor 86. Gate-drive circuit 96 controls n-channel MOS transistor 90; gate-drive circuit 98 controls n-channel MOS transistor 92; gate-drive circuit 100 controls n-channel MOS transistor 94. Persons of ordinary skill in the art will appreciate that additional resistors and associated gate-drive circuits (not shown) could be used to provide additional levels of adjustment of resistor 74. Such skilled persons will also appreciate that signals such as CLAMP A, CLAMP B, and CLAMP C may be used to control n-channel MOS transistors 90, 92, and 94.

Figure 5:
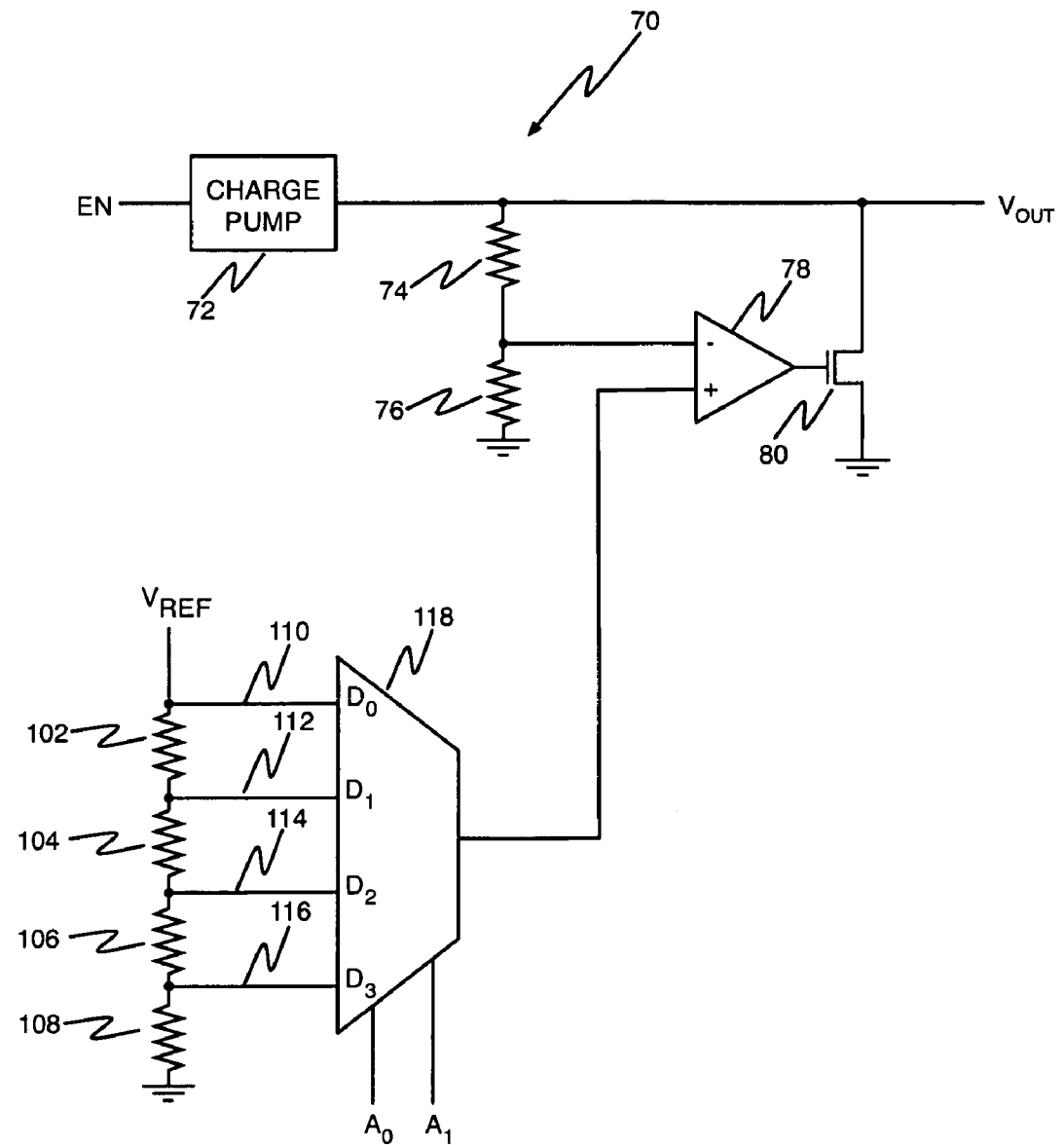
FIG. 5 is a schematic diagram of another illustrative regulator circuit suitable for use in the present invention wherein the reference voltage supplied to the regulator may be varied.

Referring now to FIG. 5, a schematic diagram shows another illustrative voltage regulator circuit suitable for use in the present invention wherein the reference voltage supplied to the regulator may be varied. As in the circuit of FIG. 4A, regulator circuit 70 of FIG. 5 regulates the output of charge pump circuit 72. Voltage divider including resistors 74 and 76 provides a sense voltage to the inverting input of comparator 78. The voltage at the inverting input of comparator 78 is compared with the output voltage $V_{MUX}$ at the non-inverting input of comparator 78. When the voltage at the inverting input of comparator 78 exceeds the voltage $V_{MUX}$, the comparator 78 changes state and turns on n-channel MOS transistor 80 as is known in the art, thus regulating the output of the charge pump to the voltage value set by the voltage divider and $V_{MUX}$.

A voltage-divider chain includes resistors 102, 104, 106, and 108, coupled in series between reference voltage $V_{REF}$ and ground. The voltage $V_{REF}$ is coupled to node 110; the voltage at the junction of resistors 102 and 104 is coupled to node 112; the voltage at the junction of resistors 104 and 106 is coupled to node 114; the voltage at the junction of resistors 106 and 108 is coupled to node 116. Nodes 110, 112, 114, and 116, are coupled to different inputs of multiplexer 118. The output $V_{MUX}$ of multiplexer 118 is coupled to the non-inverting input of comparator 78. By operating multiplexer 118, different voltages are supplied to the non-inverting input of comparator 78, thus changing the voltage output of voltage regulator 70. As will be appreciated by persons of ordinary skill in the art, the address inputs $A_0$ and $A_1$ of multiplexer 118 may be driven by a four-line to two-line decoder using the signals CLAMP A, CLAMP B, and CLAMP C, and CLAMP D as inputs. Such skilled persons will also appreciate that additional levels of regulation are possible by employing a multiplexer having more than four inputs, using more than the four resistors 102, 104, 106, and 108 and employing additional control signals.

The control signals CLAMP A, CLAMP B, CLAMP C, and CLAMP D may be generated, for example, from extra memory cells located on the integrated circuit die, one memory cell for each control signal needed. The gate of one of the control transistors 32, 40, 42, and 44 is coupled to the output of each extra memory cell. As shown in FIG. 2, memory cell A shown at reference numeral 46 is used to supply the CLAMP A signal to the clamp circuit, memory cell B at reference numeral 48 is used to supply the CLAMP B signal to the clamp circuit, memory cell C at reference numeral 50 is used to supply the CLAMP C signal to the clamp circuit, memory cell D at reference numeral 52 is used to supply the CLAMP D signal to the clamp circuit.

A logic "1" written into one of the memory cells will turn on its associated control signal. These extra memory cells may be written to during wafer test and sort and may be accessed and addressed by numerous known ways, such as employing a control I/O pin on the integrated circuit, that, when enabled, defines other I/O pins on the integrated circuit as the address and data lines for accessing the extra memory cells.

The present invention provides an advantage over the prior art. Due to process variations, each chip on a wafer or wafers from different lots may have different clamped high voltage level. The present invention takes this into account and walks out the device junctions to whatever value the high voltage will be clamped for that particular chip, plus additional guardband voltage.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A high-voltage charge pump circuit, including:
   a charge pump;
   a first high-voltage output circuit configured to set an output voltage of the charge pump at a first voltage level selected for regular programming and erasing memory cells;
   a second high-voltage output circuit configured to set the output voltage of the charge pump at a second voltage level selected for walkout of device junctions, the second voltage level being higher than the first voltage level;
   a third high-voltage output circuit configured to set the output voltage of the charge pump at a third voltage level selected for guardband programming and erasing, the third voltage level being lower than the second voltage level and higher than the first voltage level; and selection circuitry for selectively coupling one of the first, second, and third high-voltage output circuits to the output of the high-voltage charge pump circuit.

2. The high-voltage charge pump circuit of claim 1, further including a fourth high-voltage output circuit configured to set the output voltage of the charge pump at a fourth voltage level selected for walkout of device junctions, the fourth voltage level being higher than the second voltage level.

3. The high-voltage charge pump circuit of claim 1 wherein the first, second, and third second high-voltage output circuits comprise voltage-clamp circuits coupled to the output of the charge pump.

4. The high-voltage charge pump circuit of claim 2, further including:

a fourth high-voltage output circuit configured to set the output voltage of the charge pump at a fourth voltage level selected for walkout of device junctions, the fourth voltage level being higher than the second voltage level, and wherein the fourth high-voltage output circuit comprises a voltage-clamp circuit coupled to the output of the charge pump circuit.

5. The high-voltage charge pump circuit of claim 1 wherein the first, second, and third second high-voltage output circuits comprise a voltage regulator circuit coupled to the output of the charge pump, the voltage regulator circuit selectively coupleable to first, second, and third reference voltages for determining an output voltage of the voltage regulator circuit.

6. The high-voltage charge pump circuit of claim 5, further including:

a fourth high-voltage output circuit configured to set the output voltage of the charge pump at a fourth voltage level selected for walkout of device junctions, the fourth voltage level being higher than the second voltage level, and wherein the voltage regulator circuit is also selectively coupleable to a fourth reference voltage for determining an output voltage of the voltage regulator circuit.

7. The high-voltage charge pump circuit of claim 1 wherein the first, second, and third second high-voltage output circuits comprise a voltage regulator circuit coupled to the output of the charge pump, the voltage regulator circuit selectively having a voltage divider for determining an output voltage of the voltage regulator circuit, the voltage divider being selectively adjustable to set one of the first, second, and third voltage levels at the output of the voltage regulator.

8. The high-voltage charge pump circuit of claim 7, further including:

a fourth high-voltage output circuit configured to set the output voltage of the charge pump at a fourth voltage level selected for walkout of device junctions, the fourth voltage level being higher than the second voltage level, and wherein the voltage divider circuit is also selectively adjustable to set a fourth voltage level at the output pf the voltage regulator.

* * * * *